(12) United States Patent
Liu et al.

(10) Patent No.: US 10,134,668 B2
(45) Date of Patent: Nov. 20, 2018

(54) PACKAGE STRUCTURE

(71) Applicant: IBIS Innotech Inc., Taichung (TW)

(72) Inventors: Wen-Chun Liu, Taichung (TW); Wei-Jen Lai, Taichung (TW)

(73) Assignee: IBIS Innotech Inc., Taichung (TW)

( * ) Notice: Subject to any disclaimer, the term of this patent is extended or adjusted under 35 U.S.C. 154(b) by 0 days.

(21) Appl. No.: 15/657,208

(22) Filed: Jul. 24, 2017

(65) Prior Publication Data

US 2018/0294218 A1  Oct. 11, 2018

(30) Foreign Application Priority Data

Apr. 7, 2017 (TW) .............................. 106111723 A

(51) Int. Cl.
*H01L 23/495* (2006.01)
*H01L 23/498* (2006.01)
*H01L 23/00* (2006.01)

(52) U.S. Cl.
CPC .. *H01L 23/49861* (2013.01); *H01L 23/49811* (2013.01); *H01L 23/49827* (2013.01); *H01L 23/49838* (2013.01); *H01L 23/49894* (2013.01); *H01L 24/16* (2013.01); *H01L 24/48* (2013.01); *H01L 23/4952* (2013.01); *H01L 23/49531* (2013.01); *H01L 23/49833* (2013.01); *H01L 2224/16227* (2013.01); *H01L 2224/16235* (2013.01); *H01L 2224/48227* (2013.01); *H01L 2224/48235* (2013.01)

(58) Field of Classification Search
CPC ......... H01L 23/49811; H01L 23/49827; H01L 23/49838
USPC ........................................................... 257/668
See application file for complete search history.

(56) References Cited

U.S. PATENT DOCUMENTS 8,125,064 B1 * 2/2012 Lee .................... H01L 23/13
                                                          257/684
2015/0287667 A1   10/2015 Pan et al.

OTHER PUBLICATIONS

"Office Action of Taiwan Counterpart Application," dated Nov. 20, 2017, p. 1-p. 3, in which the listed reference as cited.

* cited by examiner

*Primary Examiner* — David S Blum
(74) *Attorney, Agent, or Firm* — JCIPRNET

(57) ABSTRACT

A package structure includes a lead frame, an insulator, a plurality of conductive vias, a patterned metal layer, and a chip. The lead frame includes a plurality of contacts. The insulator covers the lead frame. The conductive vias are disposed on the insulator and connected to the contacts. The patterned metal layer covers an outer surface of the insulator and includes a groove and a circuit portion. The circuit portion is connected to and covers the conductive vias and contacts. The groove surrounds the circuit portion such that the circuit portion is electrically insulated from the rest of the patterned metal layer. A surface of the insulator exposed by the groove is lower than the outer surface. The chip is disposed on the insulator and electrically connected to the circuit portion.

40 Claims, 9 Drawing Sheets

PACKAGE STRUCTURE

CROSS-REFERENCE TO RELATED APPLICATION

This application claims the priority benefit of Taiwan application serial no. 106111723, filed on Apr. 7, 2017. The entirety of the above-mentioned patent application is hereby incorporated by reference herein and made a part of this specification.

BACKGROUND

Technical Field

The embodiments of the disclosure relate to a package structure, and more particularly, to a package structure of a chip.

Description of Related Art

In today's information society, human dependence on electronic products is increasing. To meet the demands for high speed, high performance, and lightweight and compact design of current electronic products, a flexible circuit board having flexible properties is gradually applied in various electronic apparatuses such as: mobile phones, notebook PCs, digital cameras, tablet PCs, printers, and disk players.

In general, the manufacture of a circuit board mainly includes performing a pre-treatment, sputtering, copper pressing, or copper electroplating on a single surface or two opposite surfaces of an insulator, and then performing a lithography process to form a circuit layer on a single surface or two opposite surfaces of the insulator. However, the steps of the process are complex, and the process cost of sputtering is higher. Moreover, a patterned circuit layer forming by using a patterned dry layer as an electroplating barrier less readily achieves the current demand for fine pitch. Moreover, the material of the insulator mostly adopts polyimide or Ajinomoto build-up film (ABF) resin, and the cost thereof is higher. Therefore, the manufacture of the current package substrate is not only complex, but also costly.

SUMMARY

An embodiment of the disclosure provides a package structure that can directly form a circuit on an insulator such that process can be simplified and production cost can be reduced to better meet the demands of fine pitch.

A package structure of an embodiment of the disclosure includes a lead frame, an insulator, a plurality of first conductive vias, a patterned metal layer, and a chip. The lead frame includes a plurality of first contacts. The insulator covers the lead frame. The first conductive vias are disposed on the insulator and connected to the first contacts. The patterned metal layer covers an outer surface of the insulator and includes a first groove and a circuit portion. The circuit portion is connected to and covers the first conductive vias and the first contacts, and the first groove surrounds the circuit portion such that the circuit portion is electrically insulated from the rest of the patterned metal layer, wherein a surface of the insulator exposed by the first groove is lower than the outer surface. The chip is disposed on the insulator and electrically connected to the circuit portion.

In an embodiment of the disclosure, the material of insulator includes an epoxy compound, diammonium phosphate (DAP), benzocyclobutene (BCB), polyester, acrylate, fluorine polymer, polyphenylene oxide, polyimide, phenolic resin, polysulfone, silicon polymer, bismaleimide-triazine modified epoxy resin, cyanate polyester, polyethylene, polycarbonate resin, acrylonitrile-butadiene-styrene copolymer, polyethylene terephthalate (PET), polybutylene terephthalate (PBT), liquid crystal polyester (LCP), polyamide (PA), Nylon 6, polyoxometalate (POM), polyphenylene sulfide (PPS), polycarbonate (PC), polymethacrylate (PMMA), acrylonitrile butadiene styrene (ABS) resin, or cycloolefin copolymer (COC).

In an embodiment of the disclosure, the material of the insulator does not include a metal oxide complex suitable to be activated by laser, plasma, or a mechanical tool to implement metallized film coating.

In an embodiment of the disclosure, the material of the insulator includes a metal oxide complex suitable to be activated by laser, plasma, or a mechanical tool to implement metallized film coating.

In an embodiment of the disclosure, the metal oxide complex includes zinc, copper, silver, gold, nickel, palladium, platinum, cobalt, rhodium, iridium, indium, iron, manganese, aluminum, chromium, tungsten, vanadium, tantalum, titanium, or any combination thereof.

In an embodiment of the disclosure, the patterned metal layer further includes a plurality of external pads disposed on a lower surface of the insulator and electrically connected to the first contacts, wherein the lower surface is opposite to a surface where the chip is disposed.

In an embodiment of the disclosure, the lead frame includes a plurality of external pads exposed outside of the insulator and electrically connected to the first contacts.

In an embodiment of the disclosure, the insulator further includes a second conductive via disposed on the insulator and electrically connected to a ground electrode of the lead frame, and the rest of the patterned metal layer covers and is electrically connected to the second conductive via.

In an embodiment of the disclosure, the insulator further includes a device receiving cavity, and the chip and the first conductive vias are disposed in the device receiving cavity.

In an embodiment of the disclosure, the chip is electrically connected to the circuit portion via a wire bonding technique or a flip-chip packaging technique.

In an embodiment of the disclosure, the lead frame further includes at least one second contact, the insulator further includes at least one opening to expose the second contact, and the circuit portion is connected to and covers the opening and the second contact.

In an embodiment of the disclosure, the insulator further includes a second groove located in a region surrounded by the first groove and maintaining a gap from the first groove, the circuit portion covers the second groove and the gap, and a bottom surface of the second groove is lower than the outer surface.

In an embodiment of the disclosure, the material of the patterned metal layer includes gold, palladium, silver, tin, tungsten, titanium, vanadium, or copper.

In an embodiment of the disclosure, the lead frame includes a metal post array, and the first contacts include a plurality of metal posts.

In an embodiment of the disclosure, the lead frame further includes a chip pad, and the metal posts are disposed around the chip pad.

In an embodiment of the disclosure, the insulator further includes an opening to expose a top surface of the chip pad.

In an embodiment of the disclosure, a bottom surface of the chip pad is coplanar with a lower surface of each of the metal posts.

In an embodiment of the disclosure, the package structure further includes a plurality of third conductive vias disposed on the insulator, wherein the insulator covers a peripheral region of the chip pad, the third conductive vias are connected to the peripheral region, and the circuit portion is connected to the third conductive vias.

In an embodiment of the disclosure, the lead frame further includes a chip pad, the chip pad includes a notch, and a bottom surface of the notch is coplanar with the lower surface of the metal post array.

In an embodiment of the disclosure, the insulator further includes an opening to expose the bottom surface, and the metal posts surround the chip pad.

In an embodiment of the disclosure, the insulator covers a peripheral region of the chip pad, and a lower surface of the chip pad is protruded from a lower surface of the insulator.

In an embodiment of the disclosure, the package structure further includes a plurality of third conductive vias disposed on the insulator, wherein the insulator covers a peripheral region of the chip pad, the peripheral region surrounds the notch, the third conductive vias are connected to the peripheral region, and the circuit portion is connected to the third conductive vias.

In an embodiment of the disclosure, the package structure further includes a molding compound covering the chip and an upper surface of the insulator.

A package structure of an embodiment of the disclosure includes a lead frame, an insulator, a plurality of first conductive vias, a patterned metal layer, and a chip. The lead frame includes a plurality of first contacts and at least one second contact. The insulator covers the lead frame and includes at least one opening, wherein the opening exposes the second contact. The first conductive vias are disposed on the insulator and connected to the first contacts. The patterned metal layer covers an outer surface of the insulator and includes a first groove and a circuit portion, the circuit portion is connected to and covers the first conductive vias, the first contacts, the opening, and the second contact, and the first groove surrounds the circuit portion such that the circuit portion is electrically insulated from the rest of the patterned metal layer, wherein a surface of the insulator exposed by the first groove is lower than the outer surface. The chip is disposed on the insulator and electrically connected to the circuit portion.

A package structure of an embodiment of the disclosure includes a substrate, an insulator, and a patterned metal layer. The substrate includes a plurality of electrical contacts, an active surface, and a back surface opposite to the active surface, wherein the electrical contacts are disposed on the active surface. The insulator is disposed on the substrate and at least covers the active surface. The first conductive vias are disposed on the insulator and connected to the electrical contacts. The patterned metal layer covers an outer surface of the insulator and includes a first groove and a first circuit portion, the first circuit portion is connected to and covers the first conductive vias and the electrical contacts, and the first groove surrounds the circuit portion such that the first circuit portion is electrically insulated from the rest of the patterned metal layer, wherein a surface of the insulator exposed by the first groove is lower than the outer surface.

In an embodiment of the disclosure, the insulator further includes a second groove located in a region surrounded by the first groove and maintaining a gap from the first groove, the circuit portion covers the second groove and the gap, and a bottom surface of the second groove is lower than the outer surface.

In an embodiment of the disclosure, the substrate further includes a plurality of substrate through holes penetrating through the substrate and electrically connected to the active surface and the back surface of the substrate.

In an embodiment of the disclosure, the insulator covers the back surface.

In an embodiment of the disclosure, the package structure further includes a plurality of second conductive vias penetrating through the insulator covering the back surface and electrically connected to the substrate through holes, wherein the patterned metal layer further includes a third groove and a second circuit portion, the second circuit portion connects and covers the second conductive vias, and the second groove surrounds the second circuit portion to electrically insulate the second circuit portion from the rest of the patterned metal layer, wherein a surface of the insulator exposed by the second groove is lower than the outer surface.

In an embodiment of the disclosure, the package structure further includes at least one chip disposed on the insulator and electrically connected to the second circuit portion.

Based on the above, in a package structure of an embodiment of the disclosure, comprehensive chemical plating may first be performed on the insulator to form a metal layer covering the outer surface of the insulator, and then a first groove is formed on the metal layer by a means such as laser, plasma, or a mechanical tool to electrically insulate the circuit portion from the rest of the metal layer to form the patterned metal layer. Therefore, the surface of the insulator exposed after carving is lower than the outer surface of the insulator covered by the patterned metal layer. Moreover, the manufacturing process of the package structure can be effectively simplified. Also, the package structure formed by the manufacturing process can solve the issue of failing to reduce circuit pitch due to plated copper overflow at the circuit edge during the process of forming circuit by laser carving.

Moreover, the rest of the patterned metal layer outside the circuit portion covers a large area of the surface of the insulator, and can therefore be used for grounding/shielding to reduce the effects of electrostatic discharge and electromagnetic interference. Moreover, the insulator of an embodiment of the disclosure can be formed by molding, and therefore the insulator has greater design flexibility in terms of thickness and appearance. Therefore, not only can the design flexibility of the package structure of the disclosure be increased, the criteria of fine pitch can be more readily met. Also, the manufacturing process can be effectively simplified and the production cost and overall thickness of the package structure can be reduced.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
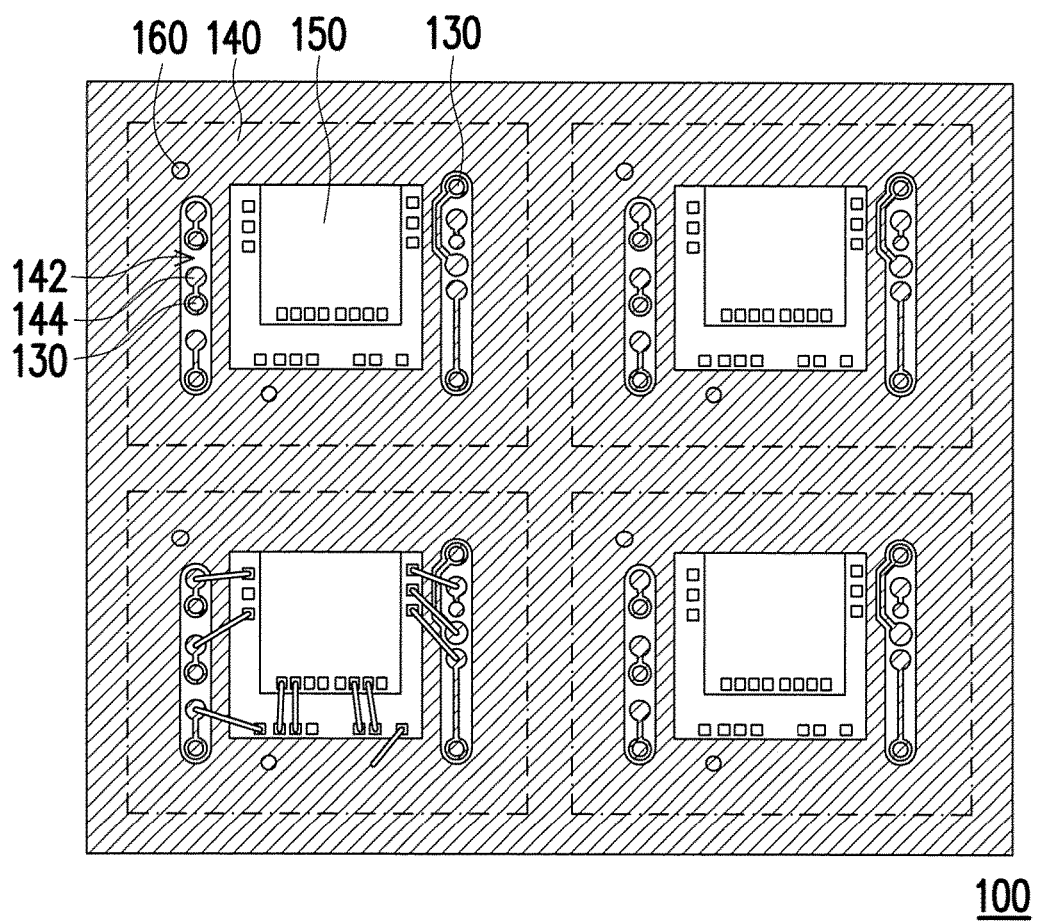
FIG. 1 is a top schematic of a package structure according to an embodiment of the disclosure.

The foregoing and other technical contents, features, and effects of the embodiments of the disclosure are intended to be described more comprehensively in each of the following embodiments accompanied with figures. In the following embodiments, terms used to indicate direction such as "up," "down," "front," "back," "left," and "right", merely refer to directions in the accompanying figures. Therefore, the directional terms are used to illustrate and are not intended to limit the embodiments of the disclosure. Moreover, in each of the embodiments below, the same or similar reference numerals are used for the same or similar devices.

Figure 2:
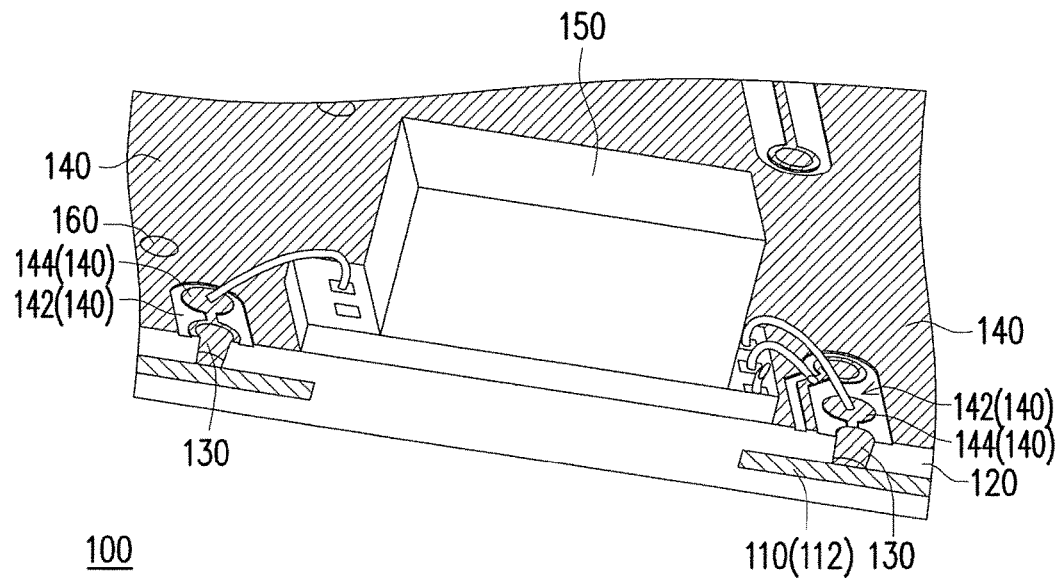
FIG. 2 is a cross-sectional schematic of a portion of a package structure according to an embodiment of the disclosure.

FIG. 1 is a top schematic of a package structure according to an embodiment of the disclosure. FIG. 2 is a cross-sectional schematic of a portion of a package structure according to an embodiment of the disclosure. Referring to both FIG. 1 and FIG. 2, in the present embodiment, a package structure 100 includes a lead frame 110, an insulator 120, a plurality of first conductive vias 130, a patterned metal layer 140, and a chip 150. The lead frame 110 includes a plurality of first contacts 112. The insulator 120 covers the lead frame 110. In the present embodiment, the insulator 120 can be molded from an insulating material by a molding process to cover the lead frame 110, and can be used as, for instance, the substrate of the package structure 100. As a result, the thickness and shape of the insulator 120 can be adjusted according to product requirements. Therefore, the package structure 100 of the present embodiment not only can simplify process and increase the flexibility of the design, but the maximum thickness of the package structure 100 can also be effectively reduced.

For instance, the material of the insulator 120 can include a dielectric material such as an epoxy resin, polyester, acrylate, fluorine polymer, polyphenylene oxide, polyimide, phenolic resin, polysulfone, silicon polymer, bismaleimide-triazine modified epoxy resin, cyanate polyester, polyethylene, polycarbonate resin, acrylonitrile-butadiene-styrene copolymer, polyethylene terephthalate (PET), polybutylene terephthalate (PBT), liquid crystal polyester (LCP), polyamide (PA), Nylon 6, polyoxometalate (POM), polyphenylene sulfide (PPS), or cycloolefin copolymer (COC). Moreover, in the present embodiment, the material of the insulator 120 may not include a metal oxide complex such as zinc, copper, silver, gold, nickel, palladium, platinum, cobalt, rhodium, iridium, indium, iron, manganese, aluminum, chromium, tungsten, vanadium, tantalum, titanium, or any combination thereof suitable to be activated by laser, plasma, or a mechanical tool to implement metallized film coating.

In the present embodiment, the first conductive vias 130 are disposed on the insulator 120 and connected to the first contacts 112 of the lead frame 110. The patterned metal layer 140 covers an outer surface of the insulator 120 and includes a first groove 142 and a circuit portion 144. The circuit portion 144 is connected to and covers the first conductive vias 130 and the first contacts 112, and the first groove 142 surrounds the circuit portion 144 such that the circuit portion 144 is electrically insulated from the rest of the patterned metal layer 140. It should be mentioned that, "the rest of the patterned metal layer 140" refers to the patterned metal layer 140 excluding the portion (such as the circuit portion 144) surrounded by the first groove 142. Moreover, referring to FIG. 2, the surface of the insulator 120 exposed by the first groove 142 is lower than the outer surface of the insulator 120 covered by the patterned metal layer 140. As a result, the chip 150 can be disposed on the insulator 120 and is, for instance, electrically connected to the circuit portion 144 of the patterned metal layer 140 via a wire bonding method. Of course, in other embodiments, the chip 150 can also be electrically connected to the circuit portion 144 of the patterned metal layer 140 using a flip-chip bonding method.

In the present embodiment, the manufacturing method of the patterned metal layer 140 may include the following steps. First, comprehensive chemical plating can be performed on the surface of the insulator 120 to form a metal layer comprehensively covering the outer surface of the insulator 120. Next, the first groove 142 is carved on the metal layer by a means such as laser, plasma, or a mechanical tool to form the patterned metal layer 140 shown in FIG. 1, wherein the first groove 142 bypasses the first conductive vias 130 and the region in which a circuit is to be formed to define the circuit portion 144 shown in FIG. 1, and the first conductive vias 130, the first contacts 112, and the circuit portion 144 are electrically insulated from the rest of the patterned metal layer 140. In the present embodiment, the material of the patterned metal layer 140 can be the same as the material of a pre-plated frame, and includes, for instance, gold, palladium, silver, tin, tungsten, titanium, vanadium, or copper.

As a result, since in the present embodiment, the first groove 142 is carved by a means such as laser, plasma, or a mechanical tool, the surface of the portion of the insulator 120 exposed by the first groove 142 is carved by laser, plasma, or a mechanical tool and is therefore lower than the outer surface of the insulator 120 covered by the patterned metal layer 140. In other words, a step difference exists between the surface of the insulator 120 exposed by the first groove 142 and the outer surface of the insulator 120 covered by the patterned metal layer 140.

In the present embodiment, the package structure 100 can further include a second conductive via 160 disposed on the insulator 120 and electrically connected to a ground electrode of the lead frame 110, and the rest of the patterned metal layer 140 covers and is electrically connected to the second conductive via 160. Since a discharge phenomenon is produced when static electricity accumulates to a certain degree during the packaging and use of the chip 150, the chip 150 is readily affected by electrostatic discharge and damaged, and therefore the rest of the patterned metal layer 140 covers the outer surface of the insulator 120 and is electrically connected to a ground electrode and therefore can be used for grounding/shielding to reduce the effects of electrostatic discharge and electromagnetic interference.

Figure 2A:
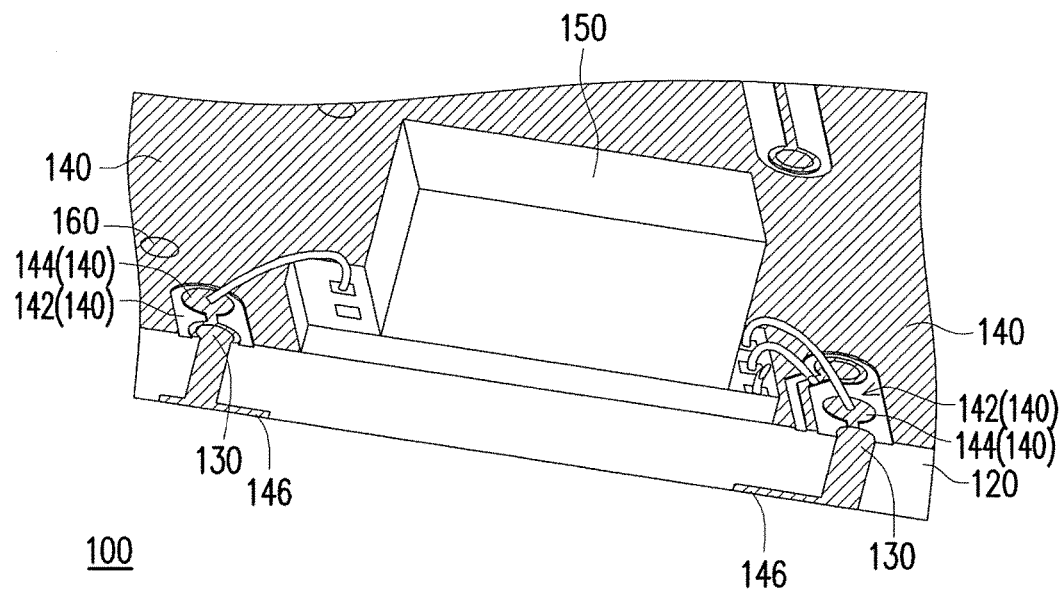
FIG. 2A is a cross-sectional schematic of a portion of a package structure according to an embodiment of the disclosure.

FIG. 2A is a cross-sectional schematic of a portion of a package structure according to an embodiment of the disclosure. It should be mentioned here that, the package structure 100 of the present embodiment is similar to the package structure 100 of FIG. 1 and FIG. 2, and therefore the present embodiment uses the reference numerals of the above embodiments and a portion of the contents thereof, wherein the same reference numerals are used to represent the same or similar devices and descriptions of the same technical content are omitted. The omitted portions are as described in the above embodiments and are not repeated in the present embodiment. In the following, the differences of the package structure 100 of the present embodiment and the package structure 100 of FIG. 1 and FIG. 2 are described.

Referring to FIG. 2A, in the present embodiment, the package structure 100 may not include the lead frame 110 shown in FIG. 2, and therefore the first conductive vias 130 can penetrate through the insulator 120. The patterned metal layer 140 similarly covers an outer surface of the insulator 120 and can include a first groove 142, a circuit portion 144, and a plurality of external pads 146. The external pads 146 are disposed on a lower surface of the insulator 120 (the lower surface is opposite to a surface where the first groove 142 is located) and electrically connected to the first conductive vias 130. Moreover, the external pads 146 are electrically insulated from the rest of the patterned metal layer 140. Therefore, the chip 150 is disposed on the insulator 120 and electrically connected to the circuit portion 144, and can be electrically connected to the external pads 146 via the first conductive vias 130.

Figure 3:
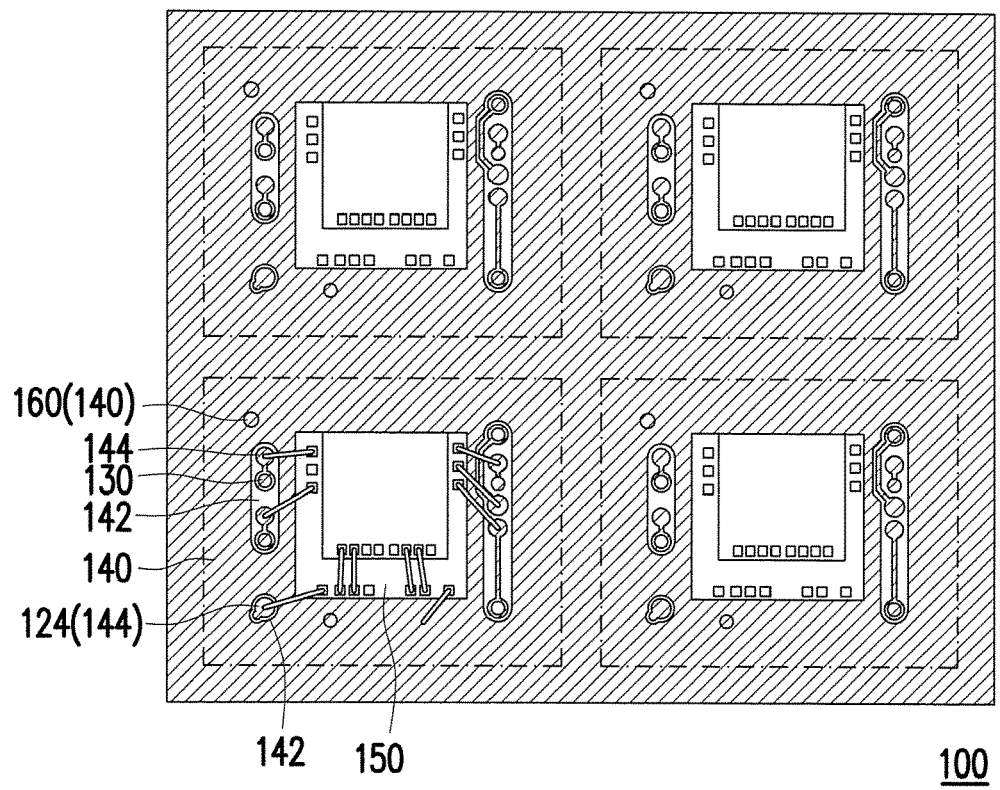
FIG. 3 is a top schematic of a package structure according to an embodiment of the disclosure.
Figure 4:
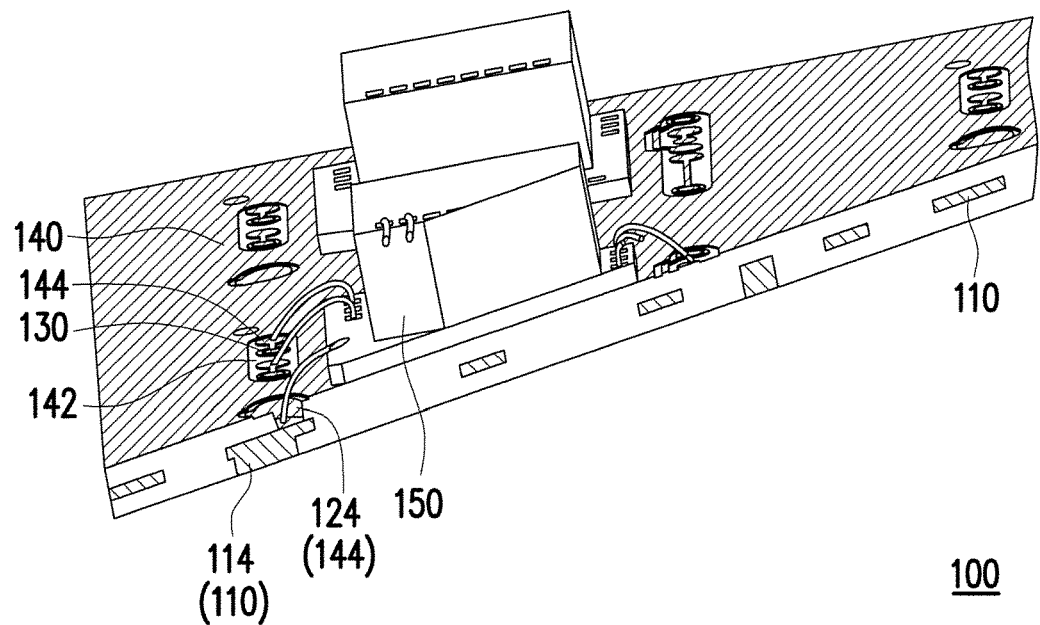
FIG. 4 is a cross-sectional schematic of a portion of a package structure according to an embodiment of the disclosure.

FIG. 3 is a top schematic of a package structure according to an embodiment of the disclosure. FIG. 4 is a cross-sectional schematic of a portion of a package structure according to an embodiment of the disclosure. It should be mentioned here that, the package structure 100 of the present embodiment is similar to the package structure 100 of FIG. 1 and FIG. 2, and therefore the present embodiment uses the reference numerals of the above embodiments and a portion of the contents thereof, wherein the same reference numerals are used to represent the same or similar devices and descriptions of the same technical content are omitted. The omitted portions are as described in the above embodiments and are not repeated in the present embodiment. Referring to FIG. 3 and FIG. 4, in the following, the differences of the package structure 100 of the present embodiment and the package structure 100 of FIG. 1 and FIG. 2 are described.

In the present embodiment, the lead frame 110 can further include at least one second contact 114, and the insulator 120 can further include at least one opening 124 to expose the second contact 114. Moreover, the first groove 142 of the patterned metal layer 140 can surround the opening 124 as shown in FIG. 3, and the circuit portion 144 is connected to and covers the opening 124 and the second contact 114 to electrically insulate the second contact 114 from the rest of the patterned metal layer 140. Under such configuration, the chip 150 of the present embodiment can be directly electrically connected to the second contact 114 of the lead frame 110 by directly opening a hole on the insulator 120. Moreover, the chip 150 can also be electrically connected to the circuit portion 144 by connecting the circuit portion 144 to the first conductive vias 130 so as to be electrically connected to the first contacts 112 of the lead frame 110 via the first conductive vias 130.

Figure 5:
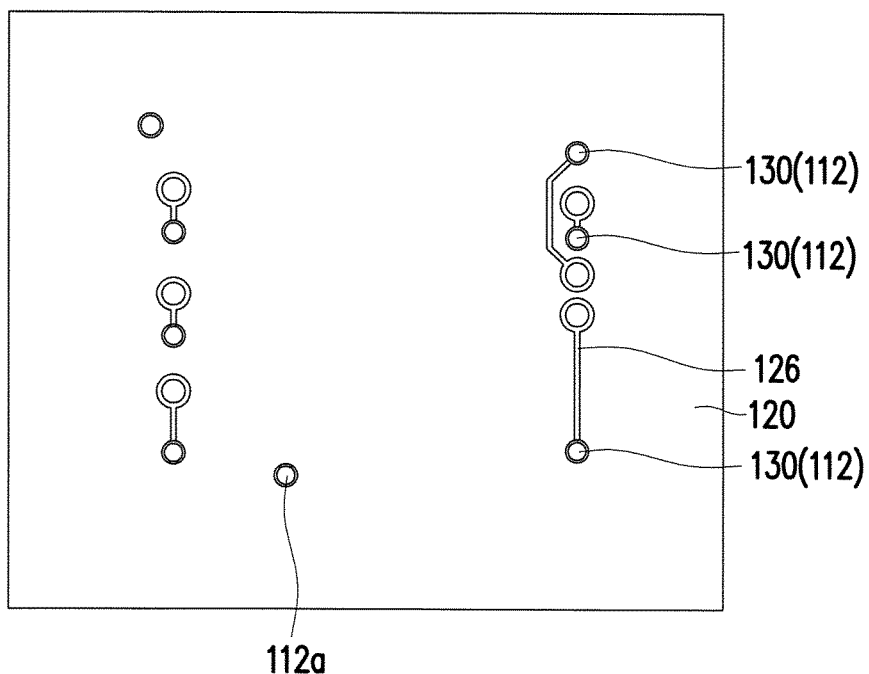
FIG. 5 is a top schematic of a manufacturing process of a package structure according to an embodiment of the disclosure.
Figure 6:
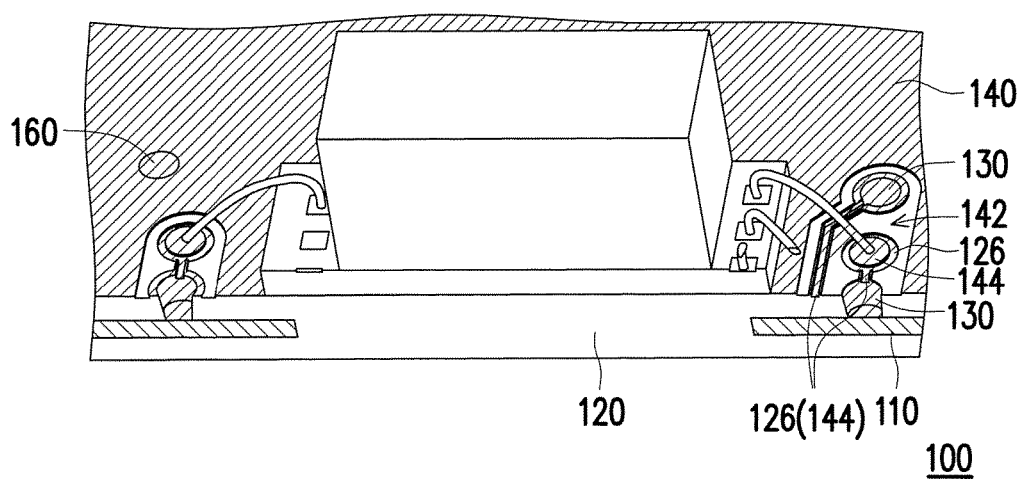
FIG. 6 is a cross-sectional schematic of a portion of a package structure according to an embodiment of the disclosure.

FIG. 5 is a top schematic of a manufacturing process of a package structure according to an embodiment of the disclosure. FIG. 6 is a cross-sectional schematic of a portion of a package structure according to an embodiment of the disclosure. It should be mentioned here that, the package structure 100 of the present embodiment is similar to the package structure 100 of FIG. 1 and FIG. 2, and therefore the present embodiment uses the reference numerals of the above embodiments and a portion of the contents thereof, wherein the same reference numerals are used to represent the same or similar devices and descriptions of the same technical content are omitted. The omitted portions are as described in the above embodiments and are not repeated in the present embodiment. Referring to FIG. 5 and FIG. 6, in the following, the differences of the package structure 100 of the present embodiment and the package structure 100 of FIG. 1 and FIG. 2 are described.

The manufacturing method of the package structure of the present embodiment can include the following steps. First, referring to FIG. 5, a second groove 126 is carved on the insulator 120 by a means such as laser, plasma, or a mechanical tool, and at the same time, drilling can be performed at the location in which the first conductive vias 130 are to be formed by a means such as laser, plasma, or a mechanical tool to expose the first contacts 112. Next, comprehensive chemical plating is performed on the surface of the insulator 120 to form a metal layer comprehensively covering the outer surface of the insulator 120, and the metal layer covers the vias to form the first conductive vias 130 (the second conductive via 160 can also be formed by the same method). Moreover, the metal layer covers the second groove 126, and therefore the contact area between the metal layer and the insulator 120 can be increased to increase the bonding force between the two.

Next, the first groove 142 is carved on the metal layer by a means such as laser, plasma, or a mechanical tool to form the patterned metal layer 140 shown in FIG. 6, wherein the first groove 142 bypasses the first conductive vias 130 and the region in which the circuit portion 144 is to be formed to define the circuit portion 144 shown in FIG. 6, and the first conductive vias 130, the first contacts 112, and the circuit portion 144 are electrically insulated from the rest of the patterned metal layer 140. As a result, the second groove 126 is located in a region surrounded by the first groove 142 and maintains a gap from the first groove 142 as shown in FIG. 6, and the circuit portion 144 covers the second groove 126 and the gap. In the present embodiment, the bottom surface of the second groove 126 is lower than the outer surface of the insulator 120 covered by the rest of the patterned metal layer 140.

Moreover, in the present embodiment, the at least one opening 124 shown in FIG. 4 can also be drilled on the insulator 120 by a means such as laser, plasma, or a mechanical tool when the second groove 126 and the vias are formed, so as to expose the second contact 114 of the lead frame 110, and the first groove 142 can surround the opening 124 as shown in FIG. 3 and the circuit portion 144 is connected to and covers the opening 124 and the second contact 144, such that the chip 150 of the present embodiment can be directly electrically connected to the second contact 114 of the lead frame 110 by directly opening a hole on the insulator 120. Moreover, the chip 150 can also be electrically connected to the circuit portion 144 by connecting the circuit portion 144 to the first conductive vias 130 so as to be electrically connected to the first contacts 112 of the lead frame 110 via the first conductive vias 130.

Moreover, the package structure 100 of the present embodiment may also not include the lead frame 110, and the circuit portion 144 can be electrically connected to the external pads 146 via the first conductive vias 130 penetrating through the insulator 120 (similar to the configuration of FIG. 2A).

Figure 7:
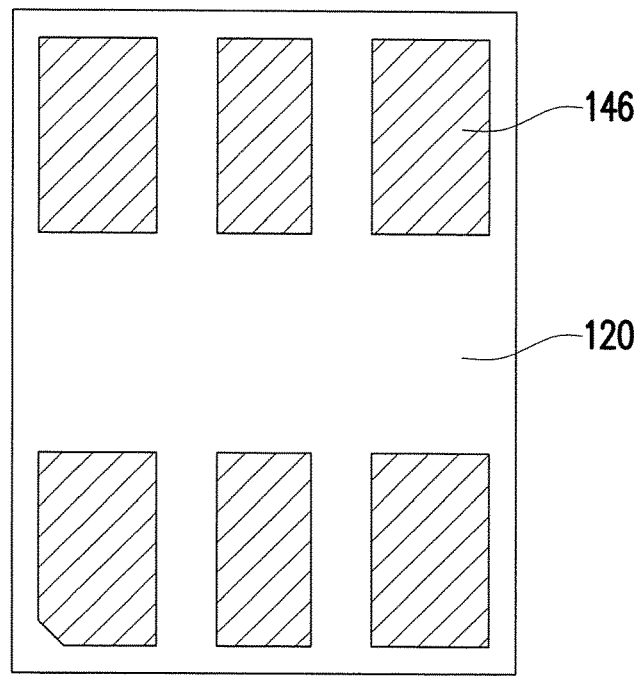
FIG. 7 is a bottom schematic of a package structure according to an embodiment of the disclosure.

FIG. 7 is a bottom schematic of a package structure according to an embodiment of the disclosure. Referring to FIG. 7, in the package structure 100 shown in FIG. 1 to FIG. 6, the lead frame 110 can include a plurality of external pads 146 exposed outside the insulator 120 and can be electrically connected to the first conductive vias 130, the first contacts 112, and the second contact 114. The patterned metal layer 140 can cover the external pads 146. Moreover, the package structure 100 can be electrically connected to an external electronic device such as a motherboard via the external pads 146 on the insulator 120.

In the present embodiment, before comprehensive chemical plating is performed on the surface of the insulator 120, a plating resist layer at least surrounding the external pads 146 can be first formed. In other words, the plating resist layer can, for instance, cover the portion without diagonal lines in FIG. 7, and then comprehensive chemical plating is performed on the surface of the insulator 120 such that the patterned metal layer 140 covers the external pads 146 and the external pads 146 are electrically insulated from the rest of the patterned metal layer 140.

Moreover, in other embodiments, the material of the insulator 120 can include a metal oxide complex suitable to be activated by laser, plasma, or a mechanical tool to implement metallized film coating. The metal oxide complex includes zinc, copper, silver, gold, nickel, palladium, platinum, cobalt, rhodium, iridium, indium, iron, manganese, aluminum, chromium, tungsten, vanadium, tantalum, titanium, or any combination thereof. As a result, the forming method of the patterned metal layer 140 covering the external pads 146 of the present embodiment can include the following steps. First, a path in which the external pads 146 are to be forming is carved on a lower surface of the insulator 120 (the lower surface is opposite to a surface where the chip 150 is disposed) by laser (such as carving the portion with the diagonal lines in FIG. 7 by laser) to carve a pad groove corresponding to the external pads 146, such that the non-conductive metal complex on the pad groove damages and releases a heavy metal nucleus having high activity for reduced metallization. Next, selective electroplating is performed on the insulator 120 after laser carving for direct chemical plating and electroplating on the pad groove to form the external pads 146 shown in FIG. 7. Therefore, the bottom surface of the external pads 146 forming by the above process is lower than the outer surface of the insulator 120. The forming method of the external pads 146 of the present embodiment can be applied in the package structure of FIG. 2, FIG. 2A, FIG. 4, and FIG. 6 to form the external pads 146 connected to the first conductive vias 130 on the lower surface of the insulator 120. Moreover, in the present embodiment, the patterned metal layer 140 on the insulator 120 can also be formed by the laser carving above and activating the metal oxide complex in the insulator 120.

Figure 8:
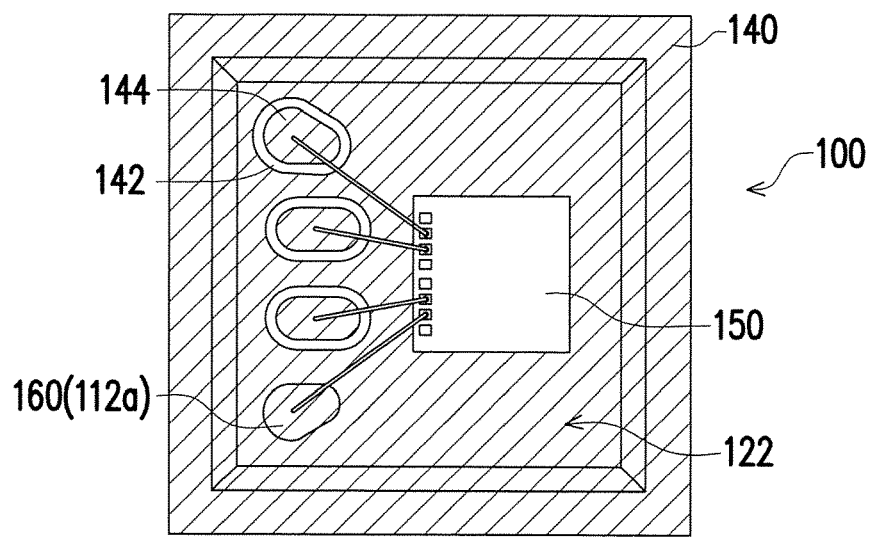
FIG. 8 is a top schematic of a package structure according to an embodiment of the disclosure.

FIG. 8 is a top schematic of a package structure according to an embodiment of the disclosure. In the present embodiment, the insulator 120 can further include a device receiving cavity 122, a chip 150, first conductive vias 130, an opening 124 (if present), and a second conductive via 160 (if present) which can all be disposed in the device receiving cavity 122. In the present embodiment, the chip 150 can be electrically connected to the circuit portion 144 via a wire bonding technique. Of course, the present embodiment is not limited thereto, and in other embodiments, the chip 150 can also be electrically connected to the circuit portion 144 via a flip-chip bonding technique.

Moreover, the package structure 100 of the present embodiment may also not include the lead frame 110, and the circuit portion 144 can be electrically connected to the external pads 146 via the first conductive vias 130 penetrating through the insulator 120 (similar to the configuration of FIG. 2A).

Figure 9:
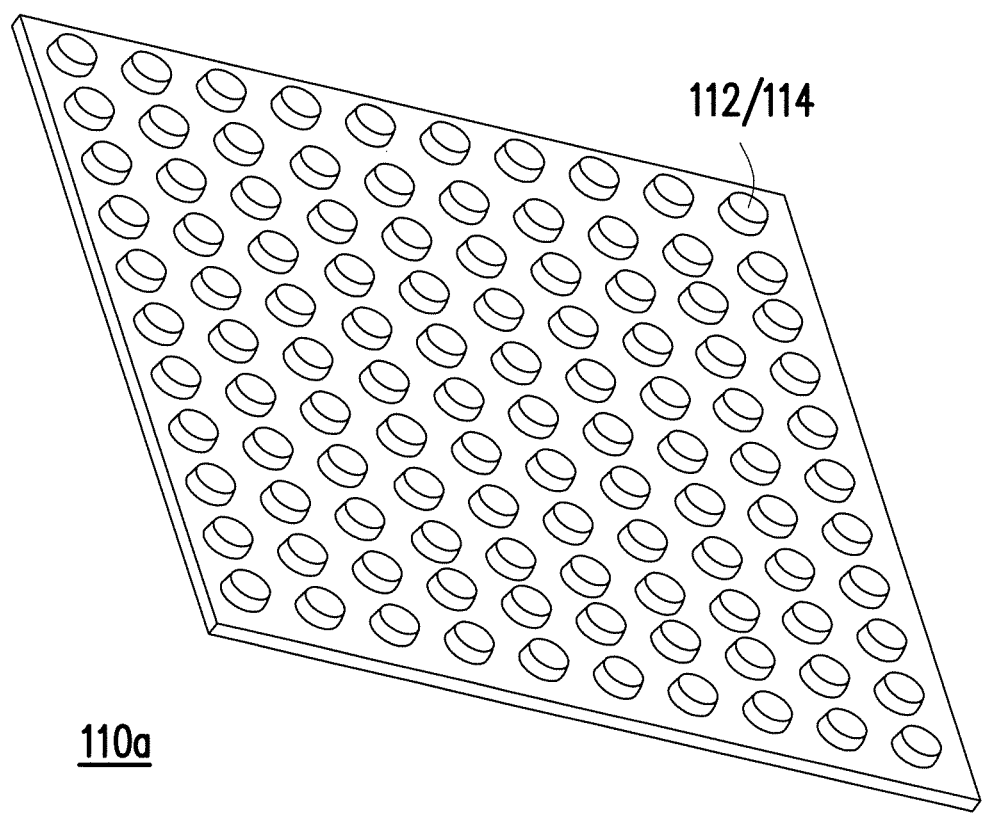
FIG. 9 is a schematic of a lead frame of a package structure according to an embodiment of the disclosure.
Figure 10:
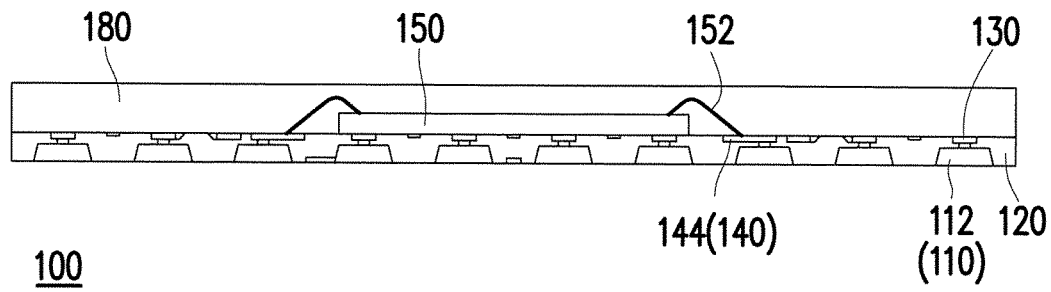
FIG. 10 is a cross-sectional schematic of a package structure according to an embodiment of the disclosure.
Figure 11:
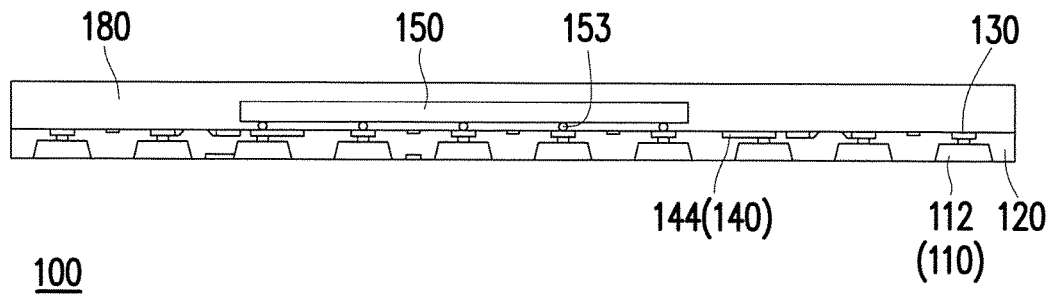
FIG. 11 is a cross-sectional schematic of a package structure according to an embodiment of the disclosure.

FIG. 9 is a schematic of a lead frame of a package structure according to an embodiment of the disclosure. FIG. 10 is a cross-sectional schematic of a package structure according to an embodiment of the disclosure. FIG. 11 is a cross-sectional schematic of a package structure according to an embodiment of the disclosure. It should be mentioned here that, the package structure 100 of the present embodiment is similar to the package structures 100 of the above embodiments, and therefore the present embodiment uses the reference numerals of the above embodiments and a portion of the contents thereof, wherein the same reference numerals are used to represent the same or similar devices and descriptions of the same technical content are omitted. The omitted portions are as described in the above embodiments and are not repeated in the present embodiment. In the following, the differences of the package structure 100 of the present embodiment and the package structure 100 of the above embodiments are described.

Referring first to FIG. 9 to FIG. 10, the lead frame 110 of the present embodiment can include a metal post array as shown in FIG. 10, the metal post array includes a plurality of metal posts 122 arranged in an array, and the metal posts 112 can be the first contacts 112/the second contact 114 above. The lead frame 110 of the present embodiment can be formed by the following steps. First, a metal substrate is provided. Next, a patterned photoresist layer is formed on an upper surface of the metal substrate. Next, a semi-etching process is performed on an upper surface of the metal substrate by using the patterned photoresist layer as an etching barrier to form a lead frame 110a having a plurality of metal posts 112 shown in FIG. 9, and the bottom portions of the metal posts 112 are connected to one another. Next, the insulator 120 shown in FIG. 10 covers the metal post array, and then another semi-etching process is performed on the bottom portion of the lead frame 110a shown in FIG. 9 to remove the bottom portion of the lead frame 110a to form the lead frame 110 including a plurality of metal posts 112 separated from one another and arranged in an array shown in FIG. 10, and the insulator 120 exposes the lower surface of the metal post array.

Next, structures such as the first conductive vias 130 and the patterned metal layer 140 are formed in order based on the manufacturing method of the above embodiments, and then the chip 150 is disposed on the insulator 120 and electrically connected to the circuit portion 144 of the patterned metal layer 140. For instance, the chip 150 can be electrically connected to the circuit portion 144 of the patterned metal layer 140 via wire bonding shown in FIG. 10 or a flip-chip bonding method shown in FIG. 11. In other words, a plurality of wires 152 shown in FIG. 10 and/or a plurality of conductive bumps 153 shown in FIG. 11 can be electrically connected to a single chip 150 or between a plurality of chips 150 and the circuit portion 144. Moreover, the package structure 100 can further include a molding compound 180 covering the chip 150 and the upper surface of the insulator 120. It should be mentioned that, the material of the molding compound 180 can be the same as the material of the insulator 120 or can be other insulating materials.

Figure 12:
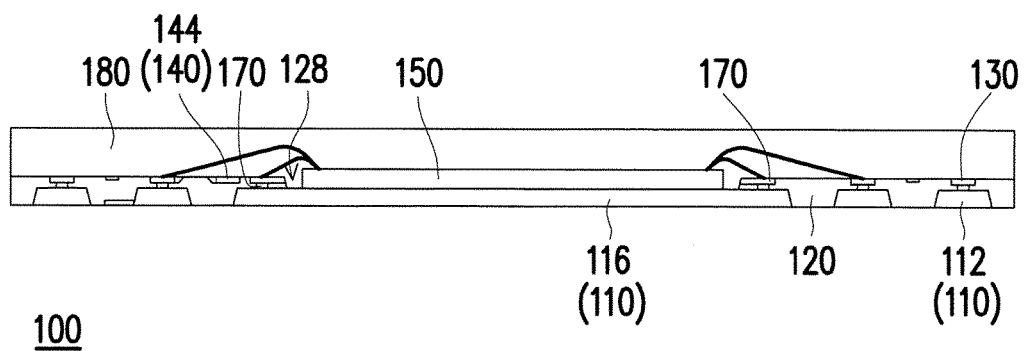
FIG. 12 is a cross-sectional schematic of a package structure according to an embodiment of the disclosure.
Figure 13:
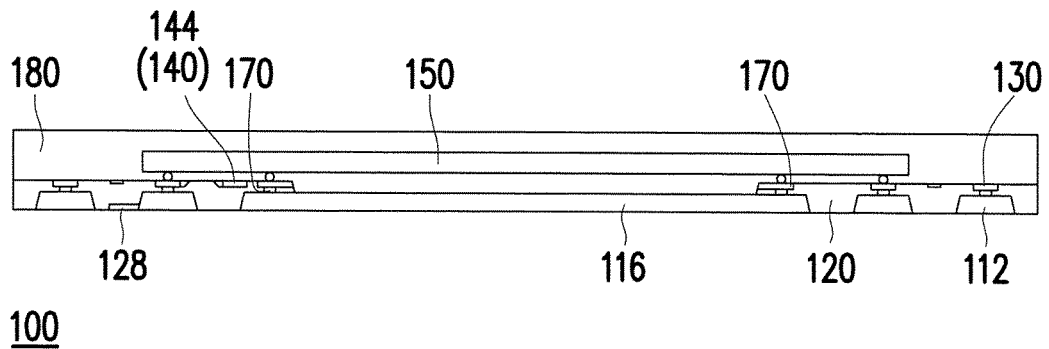
FIG. 13 is a cross-sectional schematic of a package structure according to an embodiment of the disclosure.

FIG. 12 is a cross-sectional schematic of a package structure according to an embodiment of the disclosure. FIG. 13 is a cross-sectional schematic of a package structure according to an embodiment of the disclosure. It should be mentioned here that, the package structure 100 of the present embodiment is similar to the package structure 100 of FIG. 10 and FIG. 11, and therefore the present embodiment uses the reference numerals of the above embodiments and a portion of the contents thereof, wherein the same reference numerals are used to represent the same or similar devices and descriptions of the same technical content are omitted. The omitted portions are as described in the above embodiments and are not repeated in the present embodiment. In the following, the differences of the package structure 100 of the present embodiment and the package structure 100 of FIG. 10 and FIG. 11 are described.

Referring to both FIGS. 12 and 13, in the present embodiment, the lead frame 110 can further include a chip pad 116, and the metal posts 112 can be disposed around the chip pad 116. The lead frame 110 of the present embodiment can be formed by the following steps. First, a metal substrate is provided. Next, a semi-etching process is performed on the metal substrate to form a lead frame having the chip pad 116 and the plurality of metal posts 112, and at this point, the bottom portions of the metal posts 112 and the chip pad 116 are connected to one another. Next, the insulator 120 covers the metal posts 112 and the chip pad 116, and then another semi-etching process is performed on the bottom portion of the lead frame to remove the bottom portion of the lead frame to form the lead frame 110 including the plurality of metal posts 112 separated from one another and the chip pad 116 shown in FIG. 12, and to make the insulator 120 expose the lower surfaces of the chip pad 116 and the metal posts 112. In the present embodiment, the bottom portion of the chip pad 116 is coplanar with the lower surface of each of the metal posts 112.

Next, a cavity 128 is formed on the insulator 120 to expose the top surface of the chip pad 116. Next, structures such as the first conductive vias 130 and the patterned metal layer 140 are formed in order based on the manufacturing method of the above embodiments, and then the chip 150 is disposed on the top surface of the chip pad 116 and electrically connected to the circuit portion 144 of the patterned metal layer 140. For instance, the chip 150 can be electrically connected to the circuit portion 144 of the patterned metal layer 140 via wire bonding shown in FIG. 12 or a flip-chip bonding method shown in FIG. 13. In other words, a plurality of wires 152 shown in FIG. 12 and/or a plurality of conductive bumps 153 shown in FIG. 13 can be electrically connected to a single chip 150 or between a plurality of chips 150 and the circuit portion 144.

Moreover, the package structure 100 can further include a plurality of third conductive vias 170 disposed on the insulator 120 and electrically connected to the circuit portion 144. The insulator 120 covers a peripheral region of the chip pad 116, and the third conductive vias 170 are connected to the peripheral region of the chip pad 116 as shown in FIG. 12 and FIG. 13, and the circuit portion 144 is connected to the third conductive vias 170. In the present embodiment, the third conductive vias 170 can surround the peripheral region of the chip pad 116 to form a power ring or a ground ring, and the chip 150 can be electrically connected to the circuit portion 144 of the patterned metal layer 140 via wire bonding shown in FIG. 12 or flip-chip direct bonding shown in FIG. 13. Moreover, the package structure 100 can further include a molding compound 180 covering the chip 150 and the upper surface of the insulator 120.

Figure 14:
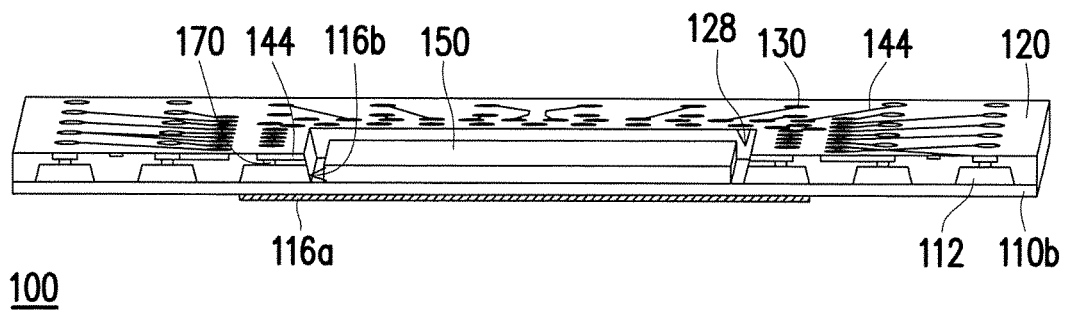
FIG. 14 and FIG. 15 are cross-sectional schematics of a manufacturing process of a package structure according to an embodiment of the disclosure.
Figure 15:
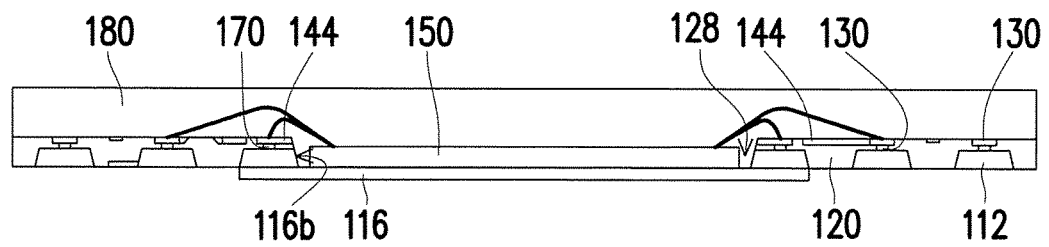

FIG. 14 and FIG. 15 are cross-sectional schematics of a manufacturing process of a package structure according to an embodiment of the disclosure. It should be mentioned here that, the package structure 100 of the present embodiment is similar to the package structure 100 of FIG. 12 and FIG. 13, and therefore the present embodiment uses the reference numerals of the above embodiments and a portion of the contents thereof, wherein the same reference numerals are used to represent the same or similar devices and descriptions of the same technical content are omitted. The omitted portions are as described in the above embodiments and are not repeated in the present embodiment. In the following, the differences of the package structure 100 of the present embodiment and the package structure 100 of FIG. 14 and FIG. 15 are described.

In the present embodiment, the lead frame 110 can also include a chip pad 116. The chip pad 116 includes a notch 116b, and a bottom surface of the notch 116b is coplanar with the lower surface of the metal posts 112 shown in FIG. 14. The process of the lead frame 110 in the present embodiment can include the following steps. First, a lead frame 110b is formed using a semi-etching process, wherein the lead frame 110b includes a plurality of metal posts 112 and a chip pad bump having the notch 116b, the metal posts 112 surround the chip pad bump shown in FIG. 14, and the bottom portions of the metal posts 112 and the chip pad bump are connected. Next, the insulator 120 is formed to cover the metal posts 112, and the insulator 120 further includes a cavity 128. The cavity 128 is located on the upper surface 122 of the insulator 120 and exposes the bottom surface of the notch 116b, and the metal posts 112 surround the cavity 128 of the insulator 120.

Next, an etching barrier layer 116a shown in FIG. 14 is formed to cover a portion of the bottom surface of the lead frame 110, and the portion of the bottom surface covered by the etching barrier layer 116a corresponds to the chip pad 116 shown in FIG. 15. Next (the preferred time point is after the molding compound 180 is formed), a semi-etching process is performed on the bottom surface of the lead frame 110a to remove the bottom surface of the lead frame 110 other than the portion covered by the etching barrier layer 116a to form the chip pad 116 shown in FIG. 15. As a result, the metal posts 112 surround the chip pad 116, the insulator 120 covers the peripheral region of the chip pad 116, and the bottom surface of the notch 116b is not coplanar with the lower surface of the metal posts 112 shown in FIG. 15. In other words, the lower surface of the chip pad 116 is protruded from the lower surface of the insulator 120.

Moreover, the package structure 100 can also include a plurality of third conductive vias 170 disposed on the insulator 120 and electrically connected to the circuit portion 144. More specifically, the third conductive vias 170 are connected to the peripheral region of the chip pad 116 as shown in FIG. 15, and the peripheral region surrounds the notch 116b. In other words, the third conductive vias 170 are connected to the peripheral region surrounding the notch 116b in the chip pad 116, and the circuit portion 144 is connected to the third conductive vias 170. In the present embodiment, the third conductive vias 170 can surround the peripheral region of the chip pad 116 to form a power ring or a ground ring, and the chip 150 of the present embodiment can also be electrically connected to the circuit portion 144 of the patterned metal layer 140 via wire bonding or flip-chip bonding. Moreover, the package structure 100 can further include a molding compound 180 covering the chip 150 and the upper surface of the insulator 120.

Figure 16:
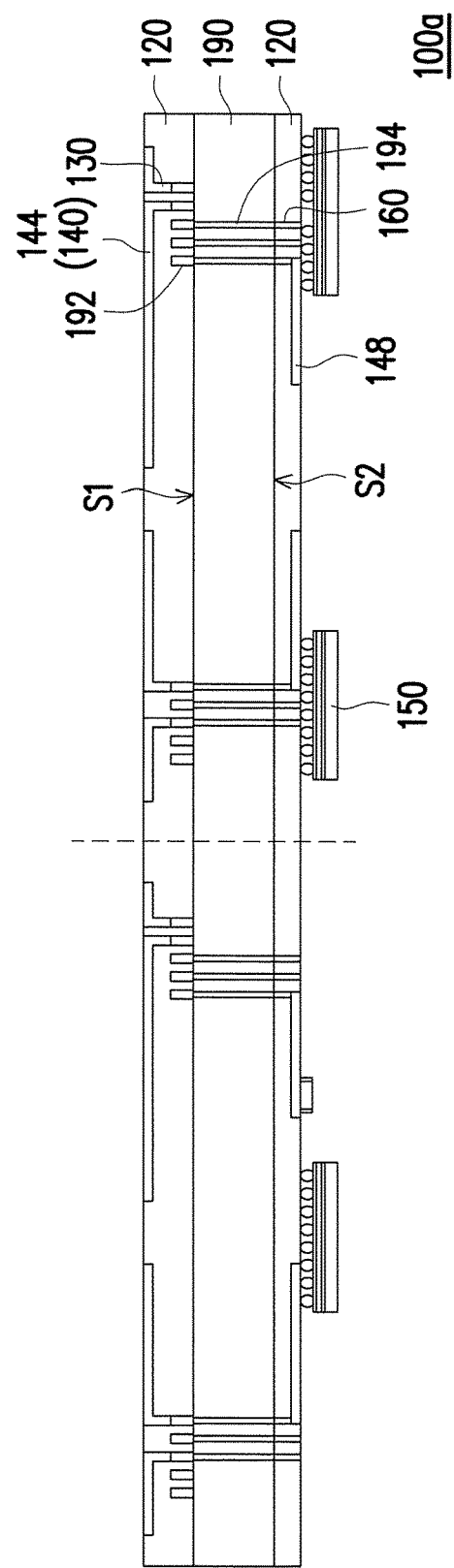
FIG. 16 is a cross-sectional schematic of a package structure according to an embodiment of the disclosure.

FIG. 16 is a cross-sectional schematic of a package structure according to an embodiment of the disclosure. It should be mentioned here that, a package structure 100a of the present embodiment is similar to the package structure 100 of the above embodiments, and therefore the present embodiment uses the reference numerals of the above embodiments and a portion of the contents thereof, wherein the same reference numerals are used to represent the same or similar devices and descriptions of the same technical content are omitted. The omitted portions are as described in the above embodiments and are not repeated in the present embodiment. In the following, the differences of the package structure 100a of the present embodiment and the package structure 100 of the above embodiments are described.

In the present embodiment, the manufacturing method of the package structure 100a includes first disposing an insulator 120 on a substrate 190, wherein the substrate 190 can be, for instance, a wafer including a plurality of electrical contacts 192, an active surface S1, and a back surface S2 opposite to the active surface S1, and the electrical contacts 192 are disposed on the active surface S1. In an embodiment, the substrate 190 can further include a plurality of substrate through holes 194 penetrating through the substrate 190 and electrically connected to the active surface S1 and the back surface S2 of the substrate 190, and the electrical contacts 192 can be optionally electrically connected to the substrate through holes 194 as needed. In the present embodiment, the substrate 190 can be, for instance, a wafer, the wafer can be formed by a plurality of chips arranged in an array, the insulator 120 covers the wafer, and the substrate through holes 194 can be through silicon vias penetrating through the wafer. Of course, the present embodiment is only exemplary, and the disclosure does not limit the type and form of the substrate 190.

In the present embodiment, the insulator 120 can at least cover the active surface S1 of the substrate 190 as shown in FIG. 16 and cover the electrical contacts 192. Moreover, in an embodiment in which the substrate 190 includes a plurality of substrate through holes 194, the insulator 120 can at least cover the active surface S1 and the back surface S2 of the substrate 190. Next, the first conductive vias 130 can be formed using a manufacturing method similar to the conductive vias above such as first digging via laser, plasma, or a mechanical tool and then performing comprehensive chemical plating such that the first conductive vias 130 are disposed on the insulator 120 and penetrate through the insulator 120 as shown in FIG. 16 to be connected to the electrical contacts 192.

Next, referring to FIG. 1 and FIG. 16, the patterned metal layer 140 (the top view thereof is as shown in FIG. 1) of the present embodiment is formed using a manufacturing method similar to the patterned metal layer 140 above, wherein the patterned metal layer 140 of the present embodiment covers the outer surface of the insulator 120 and includes a first groove 142 and a first circuit portion 144, the first circuit portion 144 is connected to and covers the first conductive vias 130 and the electrical contacts 192, and the first groove 142 surrounds the first circuit portion 144 such that the first circuit portion 144 is electrically insulated from the rest of the patterned metal layer 140, wherein the surface of the insulator 120 exposed by the first groove 142 is lower than the outer surface of the insulator 120 covered by the patterned metal layer 140.

In the present embodiment, the package structure 100a can further include a plurality of second conductive vias 160. The second conductive vias 160 penetrate through and cover the insulator 120 of the back surface S2 of the substrate 190 and are electrically connected to the substrate through holes 194. Moreover, referring to FIG. 1 and FIG. 16, the patterned metal layer 140 can further include a third groove and a second circuit portion 148 (the top view thereof is similar to those of the first groove 142 and the circuit portion 144 of FIG. 1), the second circuit portion 148 is connected to and covers the second conductive vias 160, and the third groove surrounds the second circuit portion 148 such that the second circuit portion 148 is electrically insulated from the rest of the patterned metal layer 140, wherein the surface of the insulator 120 exposed by the third groove is lower than the outer surface.

Moreover, referring to FIG. 6 and FIG. 16, in the present embodiment, a second groove 126 can be first formed on the insulator 120 of the present embodiment using a manufacturing method similar to the second groove 126 above, and the second groove 126 is located in a region surrounded by the first groove 142 and maintains a gap from the first groove 142, the circuit portion 144 covers the second groove and the gap, and the bottom surface of the second groove is lower than the outer surface, and therefore the contact area between the patterned metal layer 140 and the insulator 120 can be increased, such that the bonding force between the patterned metal layer 140 and the insulator 120 is increased.

Moreover, the package structure 100a can further include at least one chip 150 disposed on the insulator 120 and electrically connected to the first circuit portion 144 and/or the second circuit portion 148 of the patterned metal layer 140. In the present embodiment, one layer of the insulator 120 is schematically shown, but the disclosure does not limit the number of layers of the insulator 120, and a plurality of the patterned metal layer 140 and the insulator 120 can be stacked on the substrate 190 in order based on actual product requirement.

In sum, in a package structure of an embodiment of the disclosure, comprehensive chemical plating may first be performed on the insulator to form a metal layer covering the outer surface of the insulator, and then a first groove is formed on the metal layer by a means such as laser, plasma, or a mechanical tool to electrically insulate the circuit portion from the rest of the metal layer to form the patterned metal layer. Therefore, the surface of the insulator exposed after carving is lower than the outer surface of the insulator covered by the patterned metal layer. Moreover, the manufacturing process of the package structure can be effectively simplified. Also, the package structure formed by the manufacturing process can solve the issue of failing to reduce circuit pitch due to plated copper overflow at the circuit edge during the process of forming circuit by laser carving.

Moreover, in a package structure of an embodiment of the disclosure, a second groove can be first carved on the insulator at which a circuit portion is to be formed by a means such as laser, plasma, or a mechanical tool, and then comprehensive chemical plating is performed on the insulator, and the first groove is formed such that the circuit portion is electrically insulated from the rest of the metal layer. Therefore, the circuit portion covers the second groove, and the contact area thereof with the insulator can be increased as a result, such that the bonding force between the circuit portion of the patterned metal layer and the insulator can be increased.

Moreover, the rest of the patterned metal layer outside the circuit portion covers a large area of the surface of the insulator, and can therefore be used for grounding/shielding to reduce the effects of electrostatic discharge and electromagnetic interference. Moreover, the insulator of an embodiment of the disclosure can be formed by a molding process, and therefore the insulator has greater design flexibility in teens of thickness and appearance. Therefore, not only can the design flexibility of the package structure of the disclosure be increased, the criteria of fine pitch can be more readily met. Also, the manufacturing process can be effectively simplified and the production cost and overall thickness of the package structure can be reduced.

Although the disclosure has been described with reference to the above embodiments, it will be apparent to one of the ordinary skill in the art that modifications and variations to the described embodiments may be made without departing from the spirit and scope of the disclosure. Accordingly, the scope of the disclosure will be defined by the attached claims not by the above detailed descriptions.

What is claimed is:

1. A package structure, comprising:
a lead frame comprising a plurality of first contacts;
an insulator covering the lead frame;
a plurality of first conductive vias disposed on the insulator and connected to the first contacts;
a patterned metal layer covering an outer surface of the insulator and comprising a first groove and a circuit portion, the circuit portion connecting and covering the first conductive vias and the first contacts, and the first groove surrounding the circuit portion such that the circuit portion is electrically insulated from the rest of the patterned metal layer, wherein a surface of the insulator exposed by the first groove is lower than the outer surface; and
a chip disposed on the insulator and electrically connected to the circuit portion.

2. The package structure of claim 1, wherein a material of the insulator comprises an epoxy compound, diammonium phosphate (DAP), benzocyclobutene (BCB), polyester, acrylate, fluorine polymer, polyphenylene oxide, polyimide, phenolic resin, polysulfone, silicon polymer, bismaleimide-triazine modified epoxy resin, cyanate polyester, polyethylene, polycarbonate resin, acrylonitrile-butadiene-styrene copolymer, polyethylene terephthalate (PET), polybutylene terephthalate (PBT), liquid crystal polyester (LCP), polyamide (PA), Nylon 6, polyoxometalate (POM), polyphenylene sulfide (PPS), polycarbonate (PC), polymethacrylate (PMMA), acrylonitrile butadiene styrene (ABS) resin, or cycloolefin copolymer (COC).

3. The package structure of claim 1, wherein a material of the insulator does not comprise a metal oxide complex suitable to be activated by laser, plasma, or a mechanical tool to implement metallized film coating.

4. The package structure of claim 1, wherein a material of the insulator comprises a metal oxide complex suitable to be activated by laser, plasma, or a mechanical tool to implement metallized film coating.

5. The package structure of claim 4, wherein the metal oxide complex comprises zinc, copper, silver, gold, nickel, palladium, platinum, cobalt, rhodium, iridium, indium, iron, manganese, aluminum, chromium, tungsten, vanadium, tantalum, titanium, or any combination thereof.

6. The package structure of claim 1, wherein the patterned metal layer further comprises a plurality of external pads disposed on a lower surface of the insulator and electrically connected to the first contacts, wherein the lower surface is opposite to a surface where the chip is disposed.

7. The package structure of claim 1, wherein the lead frame comprises a plurality of external pads exposed outside the insulator and electrically connected to the first contacts.

8. The package structure of claim 1, further comprising a second conductive via disposed on the insulator and electrically connected to a ground electrode of the lead frame, and the rest of the patterned metal layer covers and is electrically connected to the second conductive via.

9. The package structure of claim 1, wherein the insulator further comprises a device receiving cavity, and the chip and the first conductive vias are disposed in the device receiving cavity.

10. The package structure of claim 1, wherein the lead frame further comprises at least one second contact, the insulator further comprises at least one opening to expose the second contact, and the circuit portion connects and covers the opening and the second contact.

11. The package structure of claim 1, wherein the insulator further comprises a second groove located in a region surrounded by the first groove and maintaining a gap from the first groove, the circuit portion covers the second groove and the gap, and a bottom surface of the second groove is lower than the outer surface.

12. The package structure of claim 1, wherein a material of the patterned metal layer comprises gold, palladium, silver, tin, tungsten, titanium, vanadium, or copper.

13. The package structure of claim 1, wherein the lead frame comprises a metal post array and the first contacts comprise a plurality of metal posts.

14. The package structure of claim 13, wherein the lead frame further comprises a chip pad and the metal posts are disposed around the chip pad.

15. The package structure of claim 14, wherein the insulator further comprises a cavity to expose a top surface of the chip pad.

16. The package structure of claim 14, wherein a bottom surface of the chip pad is coplanar with a lower surface of each of the metal posts.

17. The package structure of claim 14, further comprising a plurality of third conductive vias disposed on the insulator, wherein the insulator covers a peripheral region of the chip pad, the third conductive vias are connected to the peripheral region, and the circuit portion is connected to the third conductive vias.

18. The package structure of claim 13, wherein the lead frame further comprises a chip pad, the chip pad comprises a notch, and a bottom surface of the notch is coplanar with the lower surface of the metal post array.

19. The package structure of claim 18, wherein the insulator further comprises a cavity to expose the bottom surface, and the metal posts surround the chip pad.

20. The package structure of claim 19, wherein the insulator covers a peripheral region of the chip pad, and a lower surface of the chip pad is protruded from a lower surface of the insulator.

21. The package structure of claim 20, further comprising a plurality of third conductive vias disposed on the insulator, wherein the insulator covers a peripheral region of the chip pad, the peripheral region surrounds the notch, the third conductive vias are connected to the peripheral region, and the circuit portion is connected to the third conductive vias.

22. The package structure of claim 1, further comprising a molding compound covering the chip and an upper surface of the insulator.

23. A package structure, comprising:
a lead frame comprising a plurality of first contacts and at least one second contact;
an insulator covering the lead frame and comprising at least one opening, wherein the opening exposes the second contact;
a plurality of first conductive vias disposed on the insulator and connected to the first contacts;
a patterned metal layer covering an outer surface of the insulator and comprising a first groove and a circuit portion, the circuit portion connecting and covering the first conductive vias, the first contacts, the opening, and the second contact, and the first groove surrounding the circuit portion such that the circuit portion is electrically insulated from the rest of the patterned metal layer, wherein a surface of the insulator exposed by the first groove is lower than the outer surface; and
a chip disposed on the insulator and electrically connected to the circuit portion.

24. A package structure, comprising:
a substrate comprising a plurality of electrical contacts, an active surface, and a back surface opposite to the active surface, wherein the electrical contacts are disposed on the active surface;
an insulator disposed on the substrate and at least covering the active surface;
a plurality of first conductive vias disposed on the insulator and connected to the electrical contacts;
a patterned metal layer covering an outer surface of the insulator and comprising a first groove and a first circuit portion, the first circuit portion connecting and covering the first conductive vias and the electrical contacts, and the first groove surrounding the circuit portion such that the first circuit portion is electrically insulated from the rest of the patterned metal layer, wherein a surface of the insulator exposed by the first groove is lower than the outer surface.

25. The package structure of claim 24, wherein the insulator further comprises a second groove located in a region surrounded by the first groove and maintaining a gap from the first groove, the circuit portion covers the second groove and the gap, and a bottom surface of the second groove is lower than the outer surface.

26. The package structure of claim 24, wherein the substrate further comprises a plurality of substrate through holes penetrating through the substrate and electrically connected to the active surface and the back surface of the substrate.

27. The package structure of claim 25, wherein the insulator covers the back surface.

28. The package structure of claim 26, further comprising a plurality of second conductive vias penetrating through the insulator covering the back surface and electrically connected to the substrate through holes, wherein the patterned metal layer further comprises a third groove and a second circuit portion, the second circuit portion connects and covers the second conductive vias, and the third groove surrounds the second circuit portion to electrically insulate the second circuit portion from the rest of the patterned metal layer, wherein a surface of the insulator exposed by the third groove is lower than the outer surface.

29. The package structure of claim 28, further comprising at least one chip disposed on the insulator and electrically connected to the second circuit portion.

30. The package structure of claim 24, wherein the substrate is a wafer.

31. The package structure of claim 24, wherein a material of the substrate comprises glass or silicon.

32. A package structure, comprising:
an insulator;
a plurality of first conductive vias penetrating through the insulator;
a patterned metal layer covering an outer surface of the insulator and comprising a first groove, a circuit portion, and a plurality of external pads, the circuit portion connecting and covering the first conductive vias, and the first groove surrounding the circuit portion to electrically insulate the circuit portion from the rest of the patterned metal layer, wherein a surface of the insulator exposed by the first groove is lower than the outer surface, the external pads are disposed on a lower surface of the insulator electrically connected to the first conductive vias, and electrically insulated from the rest of the patterned metal layer, and the lower surface is opposite to a surface where the first groove is located; and
a chip disposed on the insulator and electrically connected to the circuit portion.

33. The package structure of claim 32, wherein a material of the insulator comprises an epoxy compound, diammonium phosphate (DAP), benzocyclobutene (BCB), polyester, acrylate, fluorine polymer, polyphenylene oxide, polyimide, phenolic resin, polysulfone, silicon polymer, bismaleimide-triazine modified epoxy resin, cyanate polyester, polyethylene, polycarbonate resin, acrylonitrile-butadiene-styrene copolymer, polyethylene terephthalate (PET), polybutylene terephthalate (PBT), liquid crystal polyester (LCP), polyamide (PA), Nylon 6, polyoxometalate (POM), polyphenylene sulfide (PPS), polycarbonate (PC), polymethacrylate (PMMA), acrylonitrile butadiene styrene (ABS) resin, or cycloolefin copolymer (COC).

34. The package structure of claim 32, wherein a material of the insulator does not comprise a metal oxide complex suitable to be activated by laser, plasma, or a mechanical tool to implement metallized film coating.

35. The package structure of claim 32, wherein a material of the insulator comprises a metal oxide complex suitable to be activated by laser, plasma, or a mechanical tool to implement metallized film coating.

36. The package structure of claim 35, wherein the metal oxide complex comprises zinc, copper, silver, gold, nickel, palladium, platinum, cobalt, rhodium, iridium, indium, iron, manganese, aluminum, chromium, tungsten, vanadium, tantalum, titanium, or any combination thereof.

37. The package structure of claim 32, further comprising a second conductive via disposed on the insulator and electrically connected to a ground electrode of the lead frame, and the rest of the patterned metal layer covers and is electrically connected to the second conductive via.

38. The package structure of claim 32, wherein the insulator further comprises a device receiving cavity, and the chip and the first conductive vias are disposed in the device receiving cavity.

39. The package structure of claim 32, wherein the insulator further comprises a second groove located in a region surrounded by the first groove and maintaining a gap from the first groove, the circuit portion covers the second groove and the gap, and a bottom surface of the second groove is lower than the outer surface.

40. The package structure of claim 32, wherein a material of the patterned metal layer comprises gold, palladium, silver, tin, tungsten, titanium, vanadium, or copper.

* * * * *